(12) United States Patent
Yi et al.

(10) Patent No.: US 12,334,895 B2
(45) Date of Patent: Jun. 17, 2025

(54) ELECTRONIC COMPONENT

(71) Applicant: TDK CORPORATION, Tokyo (JP)

(72) Inventors: Longfei Yi, Tokyo (JP); Shigemitsu Tomaki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 294 days.

(21) Appl. No.: 18/303,048

(22) Filed: Apr. 19, 2023

(65) Prior Publication Data

US 2024/0022225 A1  Jan. 18, 2024

(30) Foreign Application Priority Data

Jul. 15, 2022 (JP) ................. 2022-113801

(51) Int. Cl.
*H03H 3/007* (2006.01)
*H03H 7/01* (2006.01)
*H03H 1/00* (2006.01)

(52) U.S. Cl.
CPC ........ *H03H 7/0115* (2013.01); *H03H 7/1708* (2013.01); *H03H 7/1741* (2013.01); *H03H 2001/0085* (2013.01)

(58) Field of Classification Search
CPC ........... H03H 3/00; H03H 3/007; H03H 3/02; H03H 7/00; H03H 7/01; H03H 7/0115; H03H 7/17; H03H 7/1708; H03H 7/1741

USPC ........................................................ 333/185
See application file for complete search history.

(56) References Cited

U.S. PATENT DOCUMENTS

| | | | |
|---|---|---|---|
| 10,418,963 B2 * | 9/2019 | Kitami | ............... H03H 7/1791 |
| 2011/0148560 A1 | 6/2011 | Ikriannikov | |
| 2012/0212311 A1 | 8/2012 | Ikriannikov | |
| 2013/0241672 A1 | 9/2013 | Tamaru et al. | |
| 2024/0312701 A1 * | 9/2024 | Shibuya | ............... H01G 4/40 |

FOREIGN PATENT DOCUMENTS

| | | |
|---|---|---|
| TW | 201207869 A1 | 2/2012 |
| WO | 2012/066873 A1 | 5/2012 |

\* cited by examiner

*Primary Examiner* — Hai L Nguyen
(74) *Attorney, Agent, or Firm* — Oliff PLC

(57) ABSTRACT

An electronic component includes: a first conductor extending in one direction; a second conductor extending in the one direction; a first inductor conductor bridged so as to linearly extend between an end portion of the first conductor in its extending direction and an end portion of the second conductor in its extending direction; a connecting conductor that extends in the one direction and has a first end portion and a second end portion in its extending direction, the first end portion being connected to the first inductor conductor and being located between the first conductor and the second conductor; and a capacitor pad electrically connected to the second end portion of the connecting conductor.

6 Claims, 12 Drawing Sheets

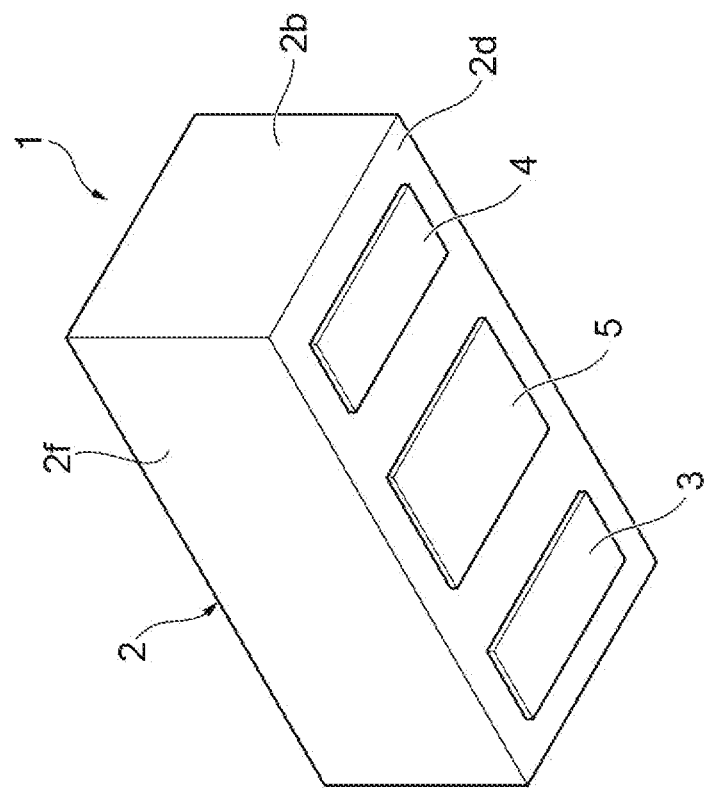
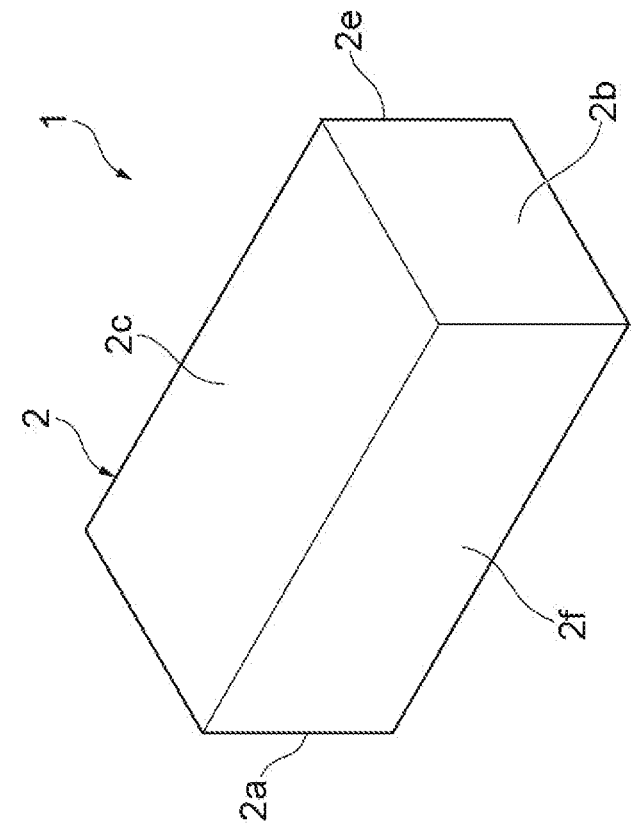

ELECTRONIC COMPONENT

TECHNICAL FIELD

The present disclosure relates to an electronic component.

BACKGROUND

Patent Literature 1 (International Publication WO 2012/066873) discloses a multilayer bandpass filter which is a laminate of a plurality of dielectric layers and a plurality of electrode layers and in which the plurality of electrode layers include a first capacitor electrode, a second capacitor electrode facing the first capacitor electrode, and an inductor electrode having a first end connected to the first capacitor electrode and a second end connected to the second capacitor electrode and forming a loop starting at the first end and ending at the second end, the inductor electrode is formed by a line electrode formed along the dielectric layers and a via electrode extending in the stacking direction of the dielectric layers, and a plurality of three or more LC parallel resonators formed by the first capacitor electrode, the second capacitor electrode, and the inductor electrode are provided. In the multilayer bandpass filter described in Patent Literature 1, the inductor electrodes of the plurality of LC parallel resonators are arranged such that the loop surfaces of the inductor electrodes radiate from a central axis extending in the stacking direction of the dielectric layers, and the inductor electrode of the input-stage LC parallel resonator and the inductor electrode of the output-stage LC parallel resonator are adjacent to each other.

SUMMARY

It is an object of one aspect of the present disclosure to provide an electronic component capable of improving the Q factor.

An electronic component according to one aspect of the present disclosure includes: a first conductor extending in one direction; a second conductor extending in the one direction; a first connection conductor bridged so as to linearly extend between an end portion of the first conductor in its extending direction and an end portion of the second conductor in its extending direction; a connecting conductor that extends in the one direction and has a first end portion and a second end portion in its extending direction, the first end portion being connected to the first connection conductor and being located between the first conductor and the second conductor; and a capacitor pad electrically connected to the second end portion of the connecting conductor.

In the electronic component according to one aspect of the present disclosure, the connecting conductor electrically connected to the capacitor pad is connected to the first connection conductor bridged between the first conductor and the second conductor, and is located between the first conductor and the second conductor. That is, the connecting conductor is suspended from the first connection conductor. Therefore, in the electronic component, a space is formed between the first conductor and the connecting conductor and between the second conductor and the connecting conductor. For this reason, in the electronic component, a magnetic field can be formed around the connecting conductor because a region where a magnetic flux is generated can be secured around the connecting conductor. Therefore, in the electronic component, it is possible to increase the apparent volume of an inductor formed by the first conductor, the second conductor, the first connection conductor, and the connecting conductor. As a result, in the electronic component, it is possible to improve the Q factor.

In the electronic component according to one aspect of the present disclosure, the first end portion of the connecting conductor may be connected to a central portion of the first connection conductor in its extending direction. In this configuration, the distance between the first conductor and the connecting conductor and the distance between the second conductor and the connecting conductor can be made equal. Therefore, it is possible to appropriately form a space between each of the first conductor and the second conductor and the connecting conductor.

The electronic component according to one aspect of the present disclosure may further include: a third conductor extending in the one direction; a fourth conductor extending in the one direction; and a second connection conductor bridged so as to linearly extend between an end portion of the third conductor in its extending direction and an end portion of the fourth conductor in its extending direction. The first end portion of the connecting conductor may be connected to the second connection conductor and located between the third conductor and the fourth conductor. In this configuration, the connecting conductor is suspended from the second connection conductor. Therefore, in the electronic component, a space is formed between the third conductor and the connecting conductor and between the fourth conductor and the connecting conductor. For this reason, in the electronic component, a magnetic field can be formed around the connecting conductor because a region where a magnetic flux is generated can be secured around the connecting conductor. Therefore, in the electronic component, it is possible to increase the apparent volume of an inductor formed by the first conductor, the second conductor, the third conductor, the fourth conductor, the first connection conductor, the second connection conductor, and the connecting conductor. As a result, in the electronic component, it is possible to improve the Q factor.

In the electronic component according to one aspect of the present disclosure, the first connection conductor and the second connection conductor may be arranged such that an extending direction of the first connection conductor and an extending direction of the second connection conductor cross each other when viewed from the one direction. The first end portion of the connecting conductor may be connected to an intersection between the first connection conductor and the second connection conductor. In this configuration, the distance between the first conductor and the connecting conductor, the distance between the second conductor and the connecting conductor, the distance between the third conductor and the connecting conductor, and the distance between the fourth conductor and the connecting conductor can be made equal. Therefore, it is possible to appropriately form a space between the connecting conductor and each of the first conductor, the second conductor, the third conductor, and the fourth conductor.

The electronic component according to one aspect of the present disclosure may further include: a plurality of the capacitor pads; and a third connection conductor that connects the second end portion of the connecting conductor and each of the plurality of capacitor pads to each other. In this configuration, a plurality of resonators can be formed.

The electronic component according to one aspect of the present disclosure may further include an element body having a pair of end surfaces facing each other in a first direction, a pair of mounting surface and main surface facing each other in a second direction, and a pair of side surfaces facing each other in a third direction and having a rectangular parallelepiped shape. The first conductor, the second conductor, the third conductor, and the fourth conductor may extend along the second direction. When viewed from the second direction, the first conductor and the second conductor may be located on a first diagonal line in the element body, and the third conductor and the fourth conductor may be located on a second diagonal line crossing the first diagonal line in the element body. In this configuration, it is possible to secure the maximum distance between the first conductor and the second conductor and the maximum distance between the third conductor and the fourth conductor in the element body. Therefore, in the electronic component, the apparent volume of an inductor formed by the first conductor, the second conductor, the third conductor, the fourth conductor, the first connection conductor, the second connection conductor, and the connecting conductor can be maximized in the limited space inside the element body. As a result, in the electronic component, it is possible to improve the Q factor.

According to one aspect of the present disclosure, it is possible to improve the Q factor.

BRIEF DESCRIPTION OF THE DRAWINGS

FIG. 1A is a perspective view of an electronic component according to a first embodiment.

FIG. 1B is a perspective view of the electronic component according to the first embodiment.

DETAILED DESCRIPTION

Figure 2:
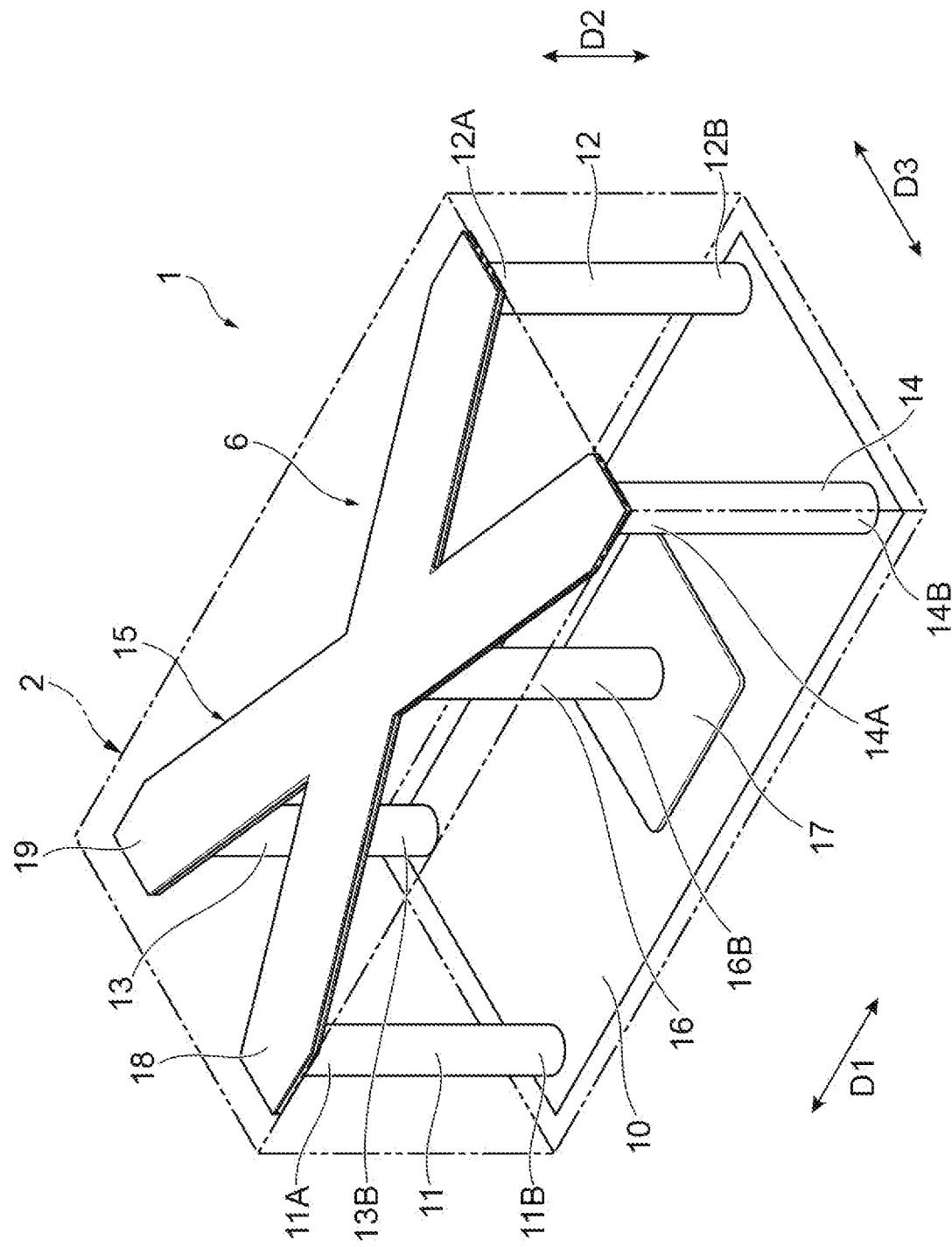
FIG. 2 is a transparent perspective view of the electronic component shown in FIGS. 1A and 1B.

Hereinafter, preferred embodiments of the present disclosure will be described in detail with reference to the accompanying diagrams. In the description of the diagrams, the same or equivalent elements are denoted by the same reference numerals, and repeated description thereof will be omitted.

First Embodiment

Figure 3:
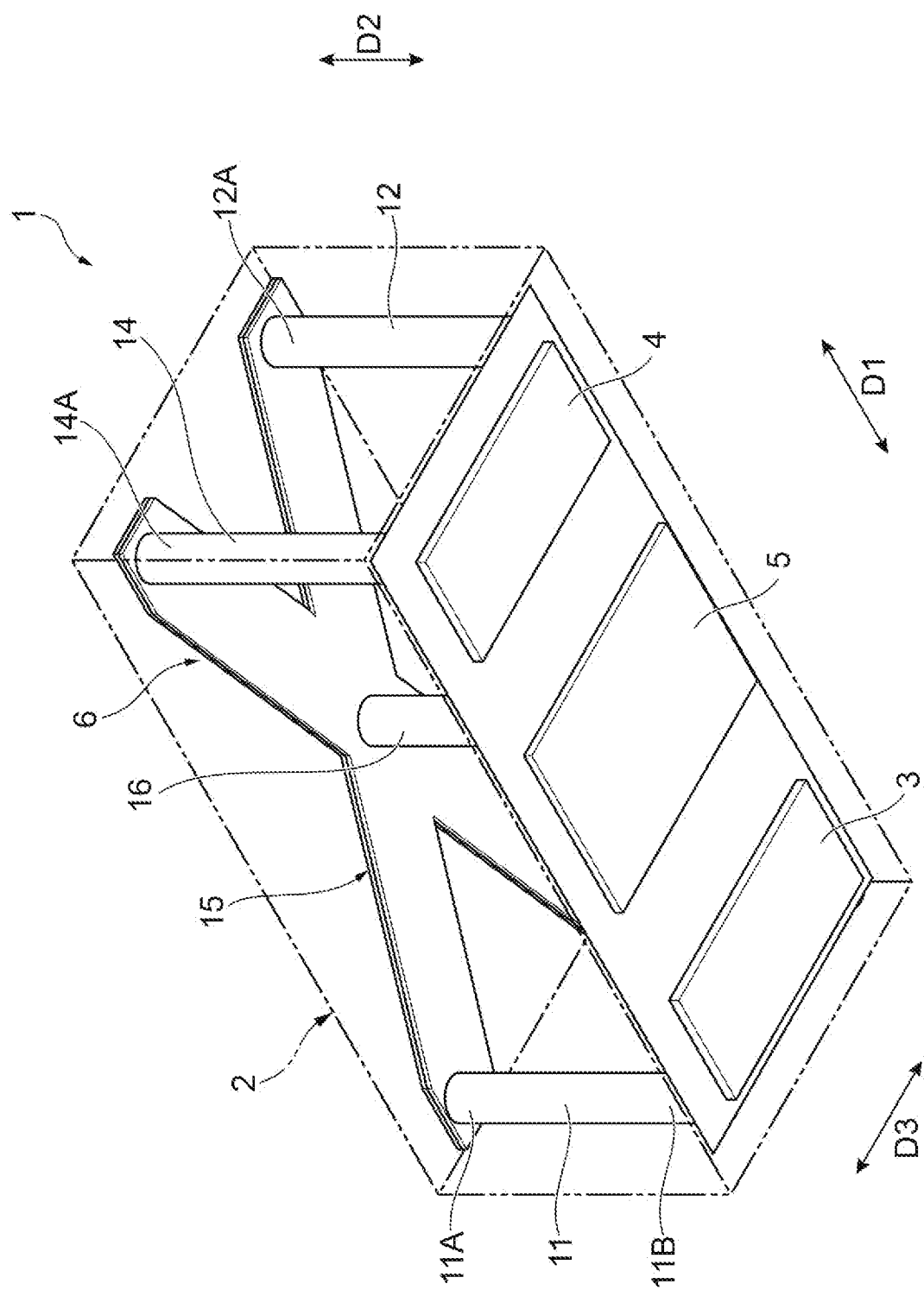
FIG. 3 is a transparent perspective view of the electronic component shown in FIGS. 1A and 1B.

An electronic component according to a first embodiment will be described with reference to FIGS. 1A, 1B, 2, and 3. FIGS. 1A and 1B are perspective views of the electronic component according to the first embodiment. FIG. 2 is a transparent perspective view of the electronic component shown in FIGS. 1A and 1B. FIG. 3 is a transparent perspective view of the electronic component shown in FIGS. 1A and 1B. As shown in FIGS. 1A, 1B, 2, and 3, an electronic component 1 includes an element body 2, a first terminal electrode 3, a second terminal electrode 4, a third terminal electrode 5, and a resonator 6. In FIGS. 2 and 3, the element body 2 is indicated by a two-dot chain line for convenience of explanation.

The element body 2 has a rectangular parallelepiped shape. Examples of the rectangular parallelepiped shape include a rectangular parallelepiped shape with chamfered corners and ridges and a rectangular parallelepiped shape with rounded corners and ridges. The element body 2 has, as outer surfaces, a pair of end surfaces 2a and 2b, a pair of main surfaces 2c and 2d, and a pair of side surfaces 2e and 2f. The end surfaces 2a and 2b face each other. The main surfaces 2c and 2d face each other. The side surfaces 2e and 2f face each other. Hereinafter, it is assumed that the facing direction of the end surfaces 2a and 2b is a first direction D1, the facing direction of the main surfaces 2c and 2d is a second direction (one direction) D2, and the facing direction of the side surfaces 2e and 2f is a third direction D3. The first direction D1, the second direction D2, and the third direction D3 are approximately perpendicular to each other.

The end surfaces 2a and 2b extend in the second direction D2 so as to connect the main surfaces 2c and 2d to each other. The end surfaces 2a and 2b also extend in the third direction D3 so as to connect the side surfaces 2e and 2f to each other. The main surfaces 2c and 2d extend in the first direction D1 so as to connect the end surfaces 2a and 2b to each other. The main surfaces 2c and 2d also extend in the third direction D3 so as to connect the side surfaces 2e and 2f to each other. The side surfaces 2e and 2f extend in the first direction D1 so as to connect the end surfaces 2a and 2b to each other. The side surfaces 2e and 2f also extend in the second direction D2 so as to connect the main surfaces 2c and 2d to each other.

The main surface 2d is a mounting surface, for example, a surface facing another electronic device when the electronic component 1 is mounted on another electronic device (not shown; for example, a circuit board or a multilayer electronic component). The end surfaces 2a and 2b are surfaces continuous from the mounting surface (that is, the main surface 2d).

A length of the element body 2 in the first direction D1 is larger than the length of the element body 2 in the second direction D2 and the length of the element body 2 in the third direction D3. The length of the element body 2 in the second direction D2 is smaller than the length of the element body 2 in the third direction D3. That is, in the present embodiment, the end surfaces 2a and 2b, the main surfaces 2c and 2d, and the side surfaces 2e and 2f have rectangular shapes. The length of the element body 2 in the second direction D2 may be equal to the length of the element body 2 in the third direction D3, or may be larger than the length of the element body 2 in the third direction D3.

In addition, in the present embodiment, "equal" may mean not only "exactly equal values" but also values including slight differences or manufacturing errors within a range set in advance. For example, a plurality of values are defined as being equal if these are within the range of ±5% of the average value of the plurality of values.

The element body 2 is formed by stacking a plurality of element body layers (not shown) in the second direction D2. That is, the stacking direction of the element body 2 is the second direction D2. In the actual element body 2, a plurality of element body layers may be integrated to such an extent that the boundary between the layers cannot be visually recognized, or may be integrated so that the boundary between the layers can be visually recognized.

Each element body layer is formed of, for example, a sintered body of a ceramic green sheet containing a dielectric material. The dielectric material includes, for example, at least one selected from a $BaTiO_3$-based material, a $Ba(Ti, Zr)O_3$-based material, a $(Ba, Ca)TiO_3$-based material, a glass material, and an alumina material.

Each of the first terminal electrode 3, the second terminal electrode 4, and the third terminal electrode 5 is provided in the element body 2. Each of the first terminal electrode 3, the second terminal electrode 4, and the third terminal electrode 5 is arranged on the main surface 2d of the element body 2. The first terminal electrode 3 and the second terminal electrode 4 are provided in the element body 2 so as to be spaced apart from each other in the first direction D1. Specifically, the first terminal electrode 3 is arranged on the end surface 2a side of the element body 2. The second terminal electrode 4 is arranged on the end surface 2b side of the element body 2. The third terminal electrode 5 is arranged between the first terminal electrode 3 and the second terminal electrode 4.

Each of the first terminal electrode 3, the second terminal electrode 4, and the third terminal electrode 5 has a rectangular shape. Each of the first terminal electrode 3, the second terminal electrode 4, and the third terminal electrode 5 is arranged such that each side extends along the first direction D1 or the third direction D3. The first terminal electrode 3, the second terminal electrode 4, and the third terminal electrode 5 protrude from the main surface 2d. That is, in the present embodiment, the surface of each of the first terminal electrode 3, the second terminal electrode 4, and the third terminal electrode 5 is not even with the main surface 2d. The first terminal electrode 3, the second terminal electrode 4, and the third terminal electrode 5 are formed of a conductive material (for example, Cu).

Each of the first terminal electrode 3, the second terminal electrode 4, and the third terminal electrode 5 may be subjected to electrolytic plating or electroless plating to form a plating layer (not shown) containing Ni, Sn, Au, or the like, for example. The plating layer may have, for example, a Ni plating film that contains Ni and covers the first terminal electrode 3, the second terminal electrode 4, and the third terminal electrode 5 and an Au plating film that contains Au and covers the Ni plating film.

Figure 4:
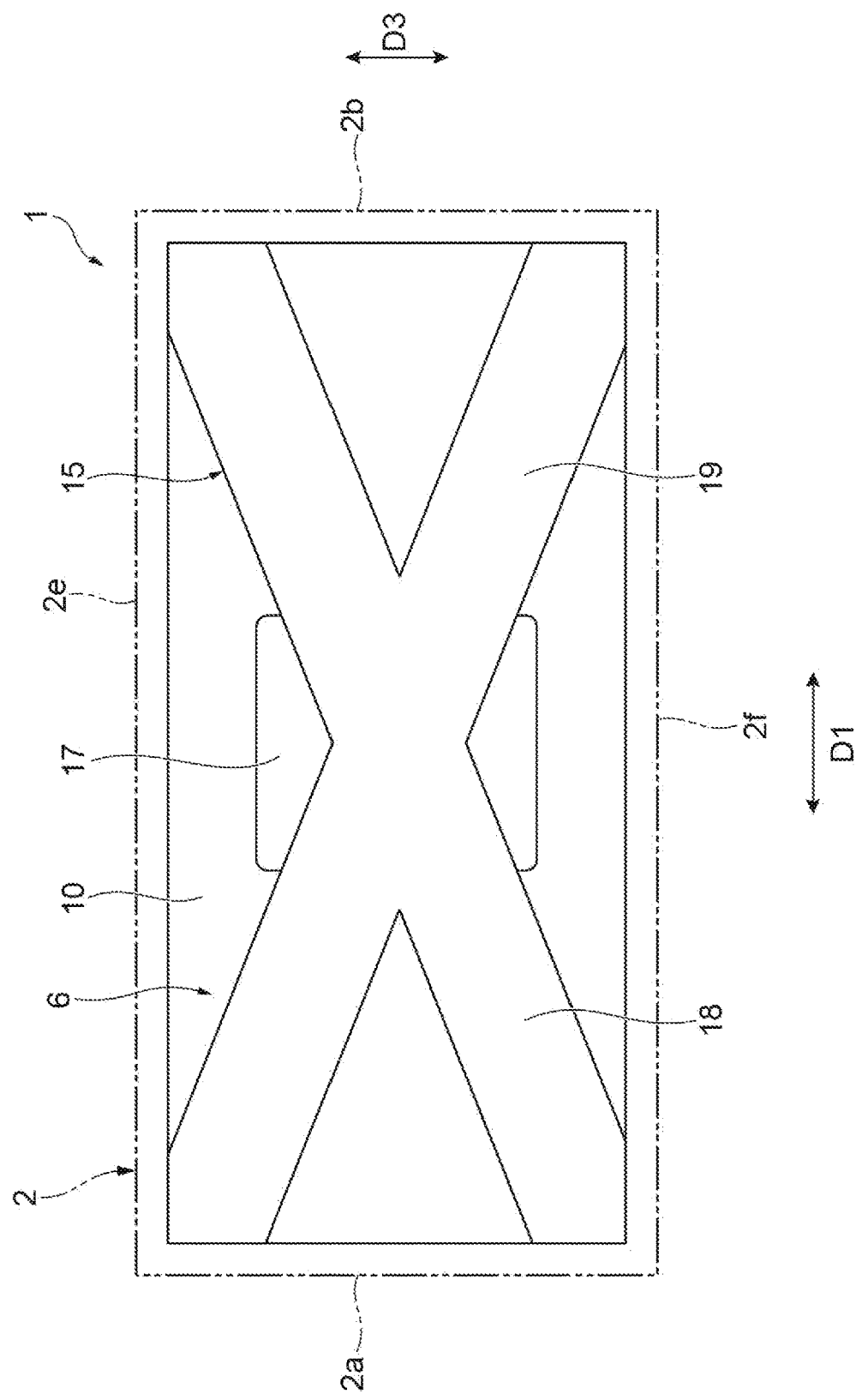
FIG. 4 is a top view of the electronic component shown in FIGS. 1A and 1B.
Figure 5:
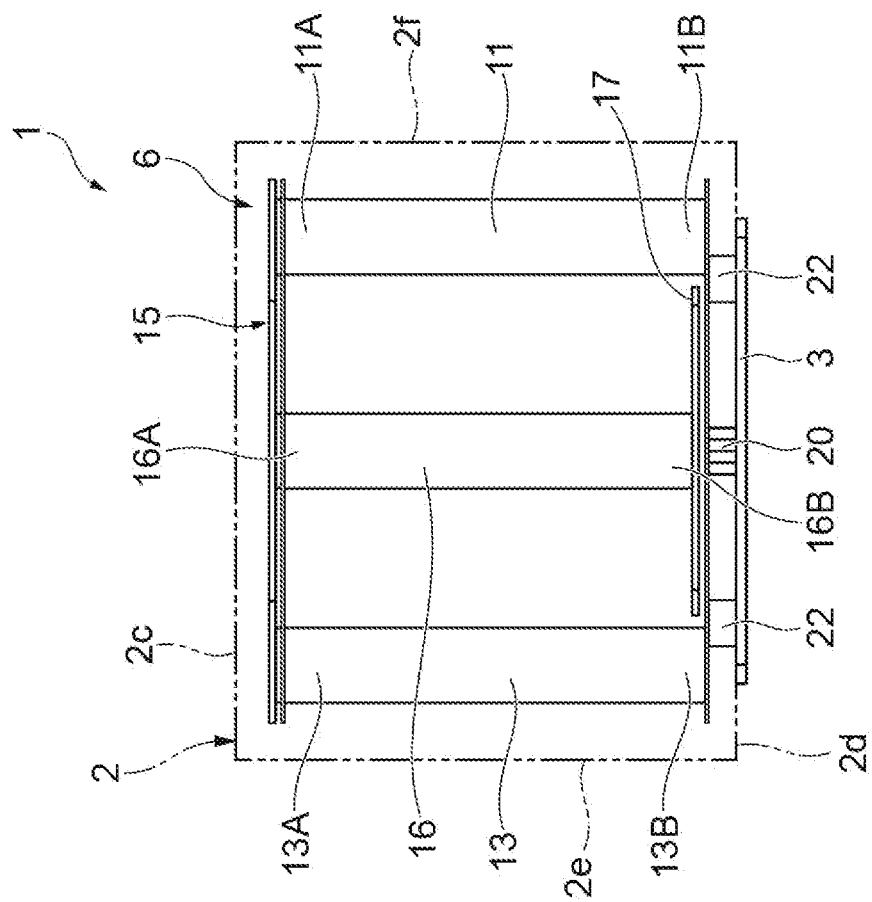
FIG. 5 is an end view of the electronic component shown in FIGS. 1A and 1B.
Figure 6:
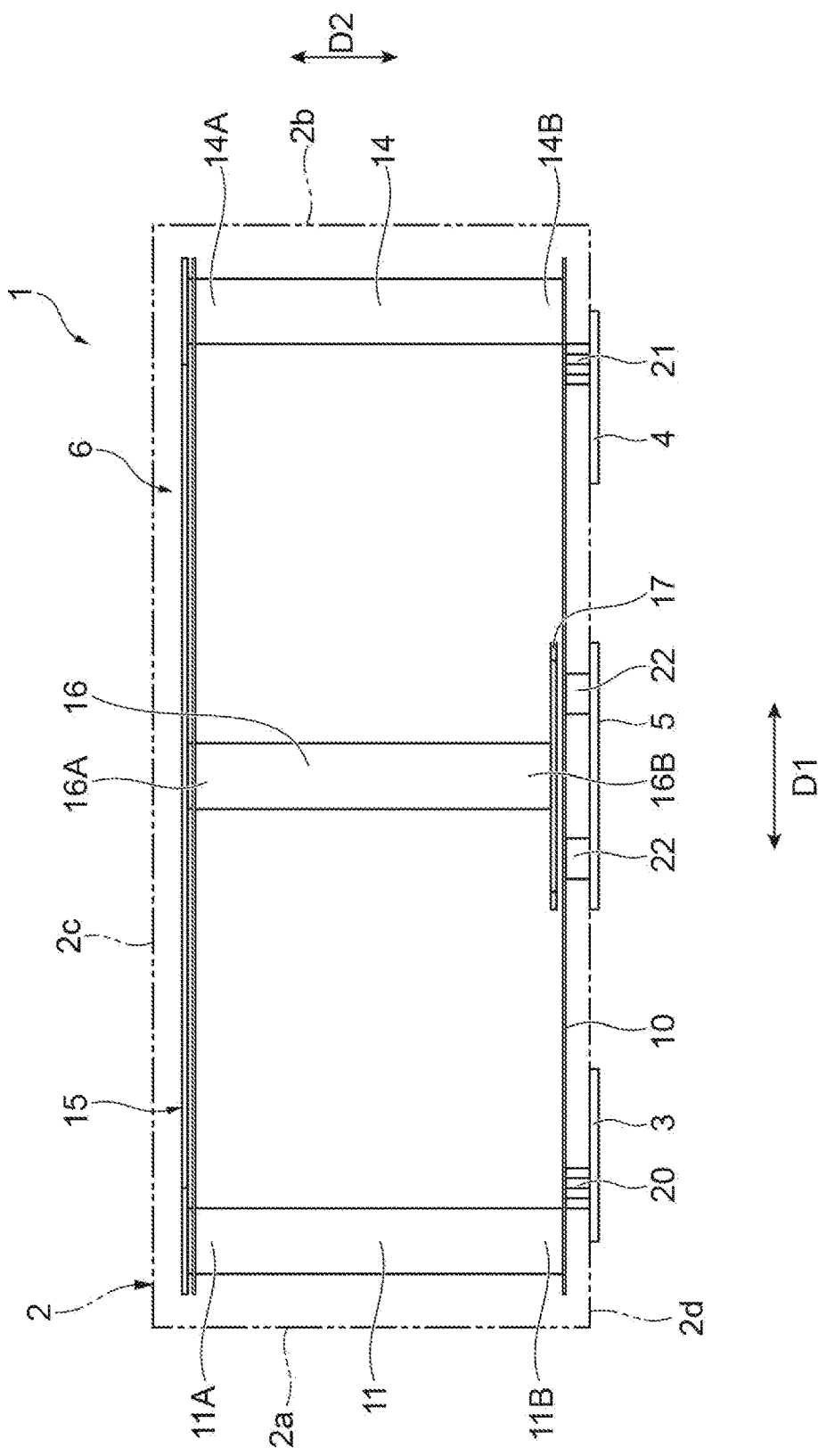
FIG. 6 is a side view of the electronic component shown in FIGS. 1A and 1B.

FIG. 4 is a top view of the electronic component shown in FIGS. 1A and 1B. FIG. 5 is an end view of the electronic component shown in FIGS. 1A and 1B. FIG. 6 is a side view of the electronic component shown in FIGS. 1A and 1B. As shown in FIGS. 1A, 1B, 2, 3, 4, 5, and 6, the resonator 6 includes a ground conductor 10, a first conductor 11, a second conductor 12, a third conductor 13, a fourth conductor 14, an inductor conductor 15, a connecting conductor 16, and a capacitor pad 17.

The ground conductor 10 is arranged on the main surface 2d side of the element body 2. The ground conductor 10 has a rectangular shape when viewed from the second direction D2. The ground conductor 10 is electrically connected to the first terminal electrode 3, the second terminal electrode 4, and the third terminal electrode 5. The ground conductor 10 and the first terminal electrode 3 are electrically connected to each other by a connection conductor 20. The ground conductor 10 and the second terminal electrode 4 are electrically connected to each other by a connection conductor 21. The ground conductor 10 and the third terminal electrode 5 are electrically connected to each other by a plurality of connection conductors 22.

The first conductor 11 extends along the second direction D2. The first conductor 11 has, for example, a cylindrical shape. The first conductor 11 can be formed by a plurality of via conductors. The first conductor 11 is arranged at each corner of the element body 2. Specifically, the first conductor 11 is arranged at a corner formed by the end surface 2a and the side surface 2f when viewed from the second direction D2. The first conductor 11 has a first end portion 11A and a second end portion 11B. The first end portion 11A of the first conductor 11 is connected to a first inductor conductor 18 (inductor conductor 15). The second end portion 11B of the first conductor 11 is connected to the ground conductor 10.

The second conductor 12 extends along the second direction D2. The second conductor 12 has, for example, a cylindrical shape. The second conductor 12 can be formed by a plurality of via conductors. The second conductor 12 is arranged at each corner of the element body 2. Specifically, the second conductor 12 is arranged at a corner formed by the end surface 2b and the side surface 2e when viewed from the second direction D2. In the element body 2, the second conductor 12 and the first conductor 11 are arranged at positions on the first diagonal line. The second conductor 12 has a first end portion 12A and a second end portion 12B. The first end portion 12A of the second conductor 12 is connected to the first inductor conductor 18 (inductor conductor 15). The second end portion 12B of the second conductor 12 is connected to the ground conductor 10.

The third conductor 13 extends along the second direction D2. The third conductor 13 has, for example, a cylindrical shape. The third conductor 13 can be formed by a plurality of via conductors. The third conductor 13 is arranged at each corner of the element body 2. Specifically, the third conductor 13 is arranged at a corner formed by the end surface 2a and the side surface 2e when viewed from the second direction D2. The third conductor 13 is arranged at a predetermined distance from the first conductor 11 in the third direction D3. The third conductor 13 has a first end portion 13A and a second end portion 13B. The first end portion 13A of the third conductor 13 is connected to a second inductor conductor 19 (inductor conductor 15). The second end portion 13B of the third conductor 13 is connected to the ground conductor 10.

The fourth conductor 14 extends along the second direction D2. The fourth conductor 14 has, for example, a cylindrical shape. The fourth conductor 14 can be formed by a plurality of via conductors. The fourth conductor 14 is arranged at each corner of the element body 2. Specifically, the fourth conductor 14 is arranged at a corner formed by the end surface 2b and the side surface 2f when viewed from the second direction D2. In the element body 2, the fourth conductor 14 and the third conductor 13 are arranged on the second diagonal line crossing the first diagonal line. The fourth conductor 14 is arranged at a predetermined distance from the second conductor 12 in the third direction D3. The fourth conductor 14 has a first end portion 14A and a second end portion 14B. The first end portion 14A of the fourth conductor 14 is connected to the second inductor conductor 19 (inductor conductor 15). The second end portion 14B of the fourth conductor 14 is connected to the ground conductor 10.

The inductor conductor 15 forms an inductor. In the present embodiment, the inductor conductor 15 is formed by two conductors arranged so as to face each other in the second direction D2. As shown in FIG. 4, the inductor conductor 15 has an approximately X shape when viewed from the second direction D2. The inductor conductor 15 has the first inductor conductor (first connection conductor) 18 and the second inductor conductor (second connection conductor) 19. In the present embodiment, the first inductor conductor 18 and the second inductor conductor 19 are integrally formed.

The first inductor conductor 18 has a predetermined width, and extends linearly. The extending direction of the first inductor conductor 18 matches the first diagonal line. The first inductor conductor 18 electrically connects the first conductor 11 and the second conductor 12 to each other. The first inductor conductor 18 is bridged between the first end portion 11A of the first conductor 11 and the first end portion 12A of the second conductor 12.

The second inductor conductor 19 has a predetermined width, and extends linearly. The extending direction of the second inductor conductor 19 matches the second diagonal line. The second inductor conductor 19 electrically connects the third conductor 13 and the fourth conductor 14 to each other. The second inductor conductor 19 is bridged between the first end portion 13A of the third conductor 13 and the first end portion 14A of the fourth conductor 14.

The first inductor conductor 18 and the second inductor conductor 19 are arranged such that their extending directions cross each other when viewed from the second direction D2. A central portion of the first inductor conductor 18 in its extending direction and a central portion of the second inductor conductor 19 in its extending direction are located so as to overlap each other.

The connecting conductor 16 extends along the second direction D2. The connecting conductor 16 has, for example, a cylindrical shape. The connecting conductor 16 can be formed by a plurality of via conductors. The connecting conductor 16 has a first end portion 16A and a second end portion 16B. The first end portion 16A of the connecting conductor 16 is connected to the inductor conductor 15. Specifically, the first end portion 16A is connected to an intersection between the first inductor conductor 18 and the second inductor conductor 19. That is, the connecting conductor 16 is connected to the central portion of each of the first inductor conductor 18 and the second inductor conductor 19 in its extending direction. It can be said that the connecting conductor 16 is fixed in a state of being suspended from the inductor conductor 15. The second end portion 16B of the connecting conductor 16 is connected to the capacitor pad 17.

The connecting conductor 16 is located between the first conductor 11 and the second conductor 12. The connecting conductor 16 is located on the first diagonal line together with the first conductor 11 and the second conductor 12. That is, the connecting conductor 16 overlaps the first conductor 11 and the second conductor 12 when viewed along the first diagonal line. The connecting conductor 16 is located between the third conductor 13 and the fourth conductor 14. The connecting conductor 16 is located on the second diagonal line together with the third conductor 13 and the fourth conductor 14. That is, the connecting conductor 16 overlaps the third conductor 13 and the fourth conductor 14 when viewed along the second diagonal line.

The capacitor pad 17 forms a capacitor. The capacitor pad 17 has an approximately rectangular shape. The capacitor pad 17 is connected to the connecting conductor 16. The capacitor pad 17 is connected to the second end portion 16B of the connecting conductor 16. The capacitor pad 17 is arranged so as to face the ground conductor 10.

Figure 7:
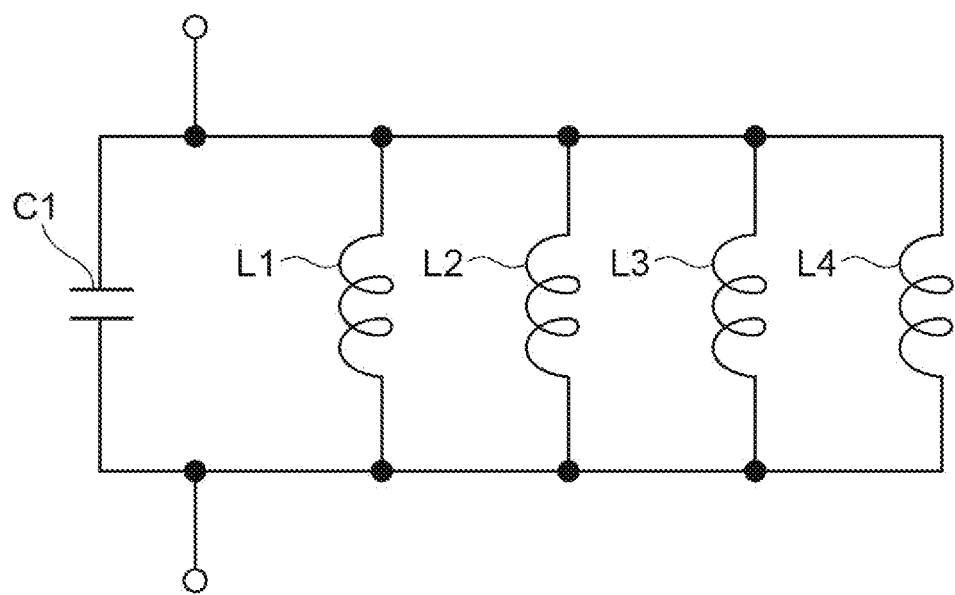
FIG. 7 is an equivalent circuit diagram of the electronic component shown in FIGS. 1A and 1B.

FIG. 7 is an equivalent circuit diagram of the electronic component 1 shown in FIGS. 1A and 1B. As shown in FIG. 7, the electronic component 1 includes a capacitor C1, a first inductor L1, a second inductor L2, a third inductor L3, and a fourth inductor L4. The capacitor C1, the first inductor L1, the second inductor L2, the third inductor L3, and the fourth inductor L4 form an LC resonator.

The capacitor C1 is formed by the ground conductor 10 and the capacitor pad 17. The first inductor L1 is formed by the first conductor 11, the connecting conductor 16, and the first inductor conductor 18. The second inductor L2 is formed by the second conductor 12, the connecting conductor 16, and the first inductor conductor 18. The third inductor L3 is formed by the third conductor 13, the connecting conductor 16, and the second inductor conductor 19. The fourth inductor L4 is formed by the fourth conductor 14, the connecting conductor 16, and the second inductor conductor 19.

As described above, in the electronic component 1 according to the present embodiment, the connecting conductor 16 electrically connected to the capacitor pad 17 is connected to the first inductor conductor 18 bridged between the first conductor 11 and the second conductor 12, and is located between the first conductor 11 and the second conductor 12. That is, the connecting conductor 16 is suspended from the first inductor conductor 18. Therefore, in the electronic component 1, a space is formed between the first conductor 11 and the connecting conductor 16 and between the second conductor 12 and the connecting conductor 16. For this reason, in the electronic component 1, a magnetic field can be formed around the connecting conductor 16 because a region where a magnetic flux is generated can be secured around the connecting conductor 16. Therefore, in the electronic component 1, it is possible to increase the apparent volume of an inductor formed by the first conductor 11, the second conductor 12, the first inductor conductor 18, and the connecting conductor 16. As a result, in the electronic component 1, it is possible to improve the Q factor.

In the electronic component 1 according to the present embodiment, the first end portion 16A of the connecting conductor 16 is connected to the central portion of the first inductor conductor 18 in its extending direction. In this configuration, the distance between the first conductor 11 and the connecting conductor 16 and the distance between the second conductor 12 and the connecting conductor 16 can be made equal. Therefore, it is possible to appropriately form a space between each of the first conductor 11 and the second conductor 12 and the connecting conductor 16.

The electronic component 1 according to the present embodiment includes the third conductor 13, the fourth conductor 14, and the second inductor conductor 19. In the electronic component 1, the first end portion 16A of the connecting conductor 16 is connected to the second inductor conductor 19 and located between the third conductor 13 and the fourth conductor 14. In this configuration, the connecting conductor 16 is suspended from second inductor conductor 19. Therefore, in the electronic component 1, a space is formed between the third conductor 13 and the connecting conductor 16 and between the fourth conductor 14 and the connecting conductor 16. For this reason, in the electronic component 1, a magnetic field can be formed around the connecting conductor 16 because a region where a magnetic flux is generated can be secured around the connecting conductor 16. Therefore, in the electronic component 1, it is possible to increase the apparent volume of an inductor formed by the first conductor 11, the second conductor 12, the third conductor 13, the fourth conductor 14, the first inductor conductor 18, the second inductor conductor 19, and the connecting conductor 16. As a result, in the electronic component 1, it is possible to improve the Q factor.

In the electronic component 1 according to the present embodiment, the first inductor conductor 18 and the second inductor conductor 19 are arranged such that the extending direction of the first inductor conductor 18 and the extending direction of the second inductor conductor 19 cross each other when viewed from the second direction D2. The first end portion 16A of the connecting conductor 16 is connected to an intersection between the first inductor conductor 18 and the second inductor conductor 19. In this configuration, the distance between the first conductor 11 and the connecting conductor 16, the distance between the second conductor 12 and the connecting conductor 16, the distance between the third conductor 13 and the connecting conductor 16, and the distance between the fourth conductor 14 and the connecting conductor 16 can be made equal. Therefore, it is possible to appropriately form a space between the connecting conductor 16 and each of the first conductor 11, the second conductor 12, the third conductor 13, and the fourth conductor 14.

In the electronic component 1 according to the present embodiment, when viewed from the second direction D2, the first conductor 11 and the second conductor 12 are located on the first diagonal line in the element body 2, and the third conductor 13 and the fourth conductor 14 are located on the second diagonal line crossing the first diagonal line in the element body 2. In this configuration, it is possible to secure the maximum distance between the first conductor 11 and the second conductor 12 and the maximum distance between the third conductor 13 and the fourth conductor 14 in the element body 2. Therefore, in the electronic component 1, the apparent volume of an inductor formed by the first conductor 11, the second conductor 12, the third conductor 13, the fourth conductor 14, the first inductor conductor 18, the second inductor conductor 19, and the connecting conductor 16 can be maximized in the limited space inside the element body 2. As a result, in the electronic component 1, it is possible to improve the Q factor.

Second Embodiment

Figure 8:
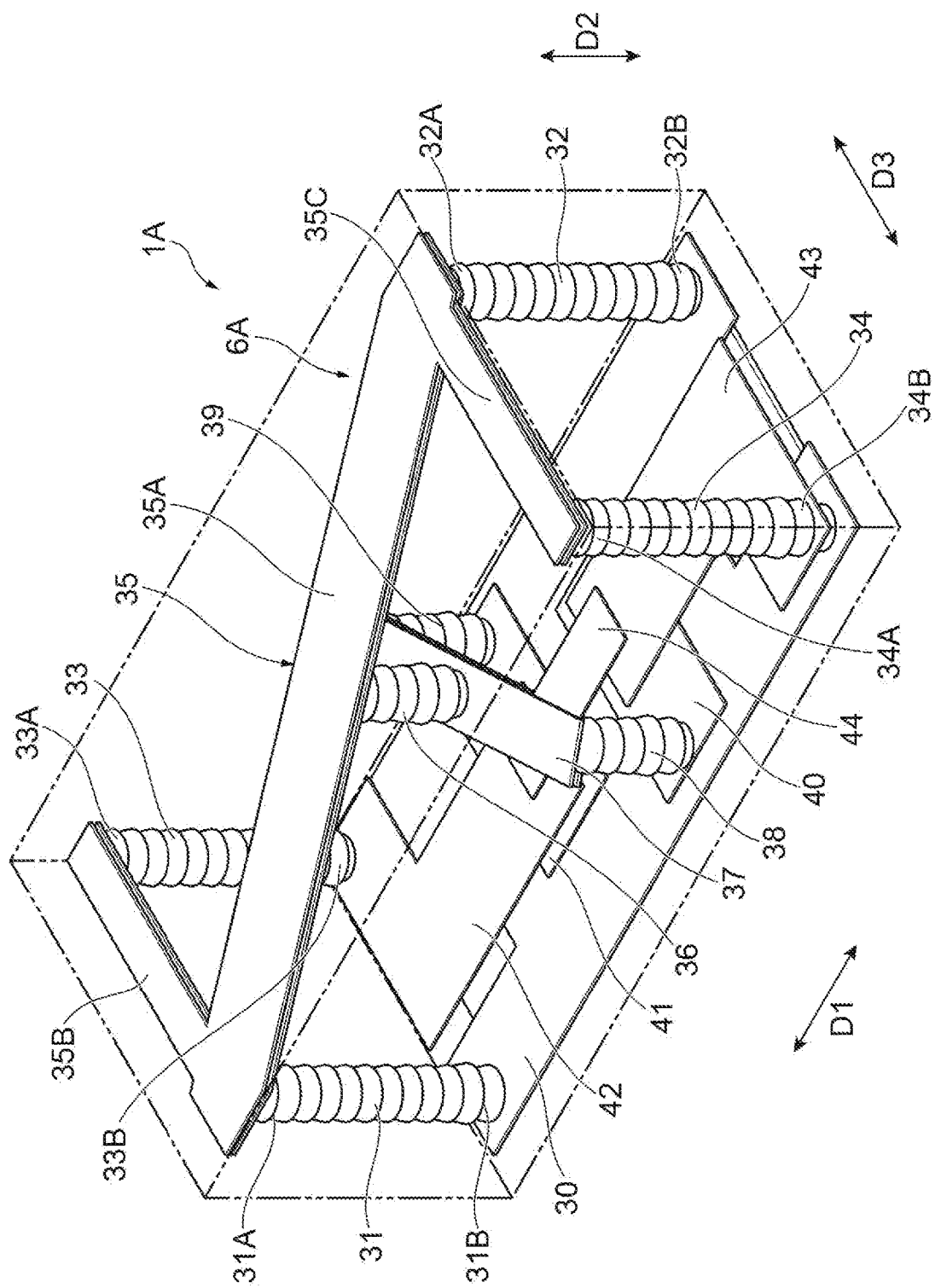
FIG. 8 is a transparent perspective view of an electronic component according to a second embodiment.
Figure 9:
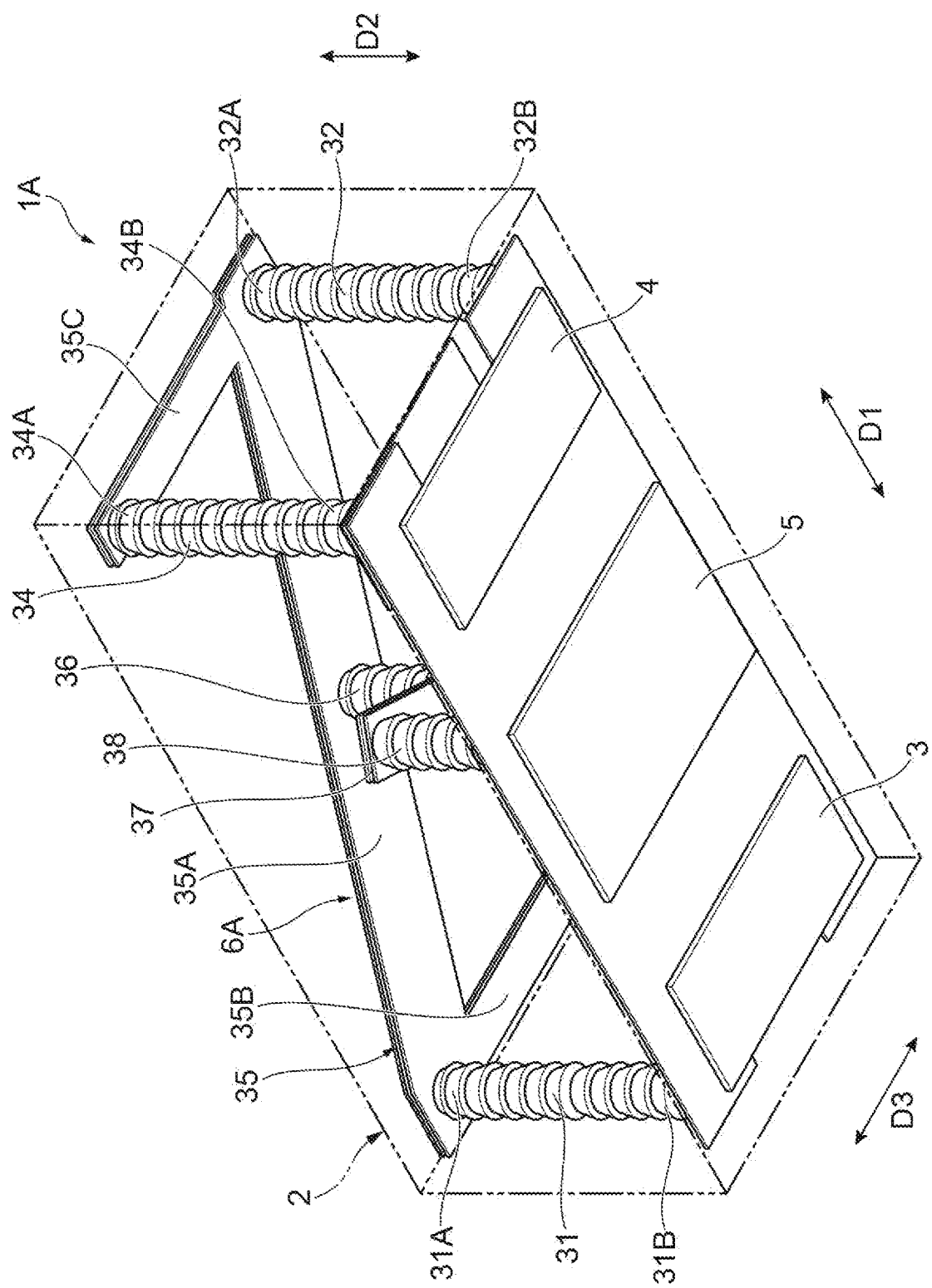
FIG. 9 is a transparent perspective view of the electronic component shown in FIG. 8.

Next, a second embodiment will be described. FIG. 8 is a transparent perspective view of an electronic component according to a second embodiment. FIG. 9 is a transparent perspective view of the electronic component shown in FIG. 8. As shown in FIGS. 8 and 9, an electronic component 1A includes an element body 2, a first terminal electrode 3, a second terminal electrode 4, a third terminal electrode 5, and a resonator 6A. In FIGS. 8 and 9, the element body 2 is indicated by a two-dot chain line for convenience of explanation.

Figure 10:
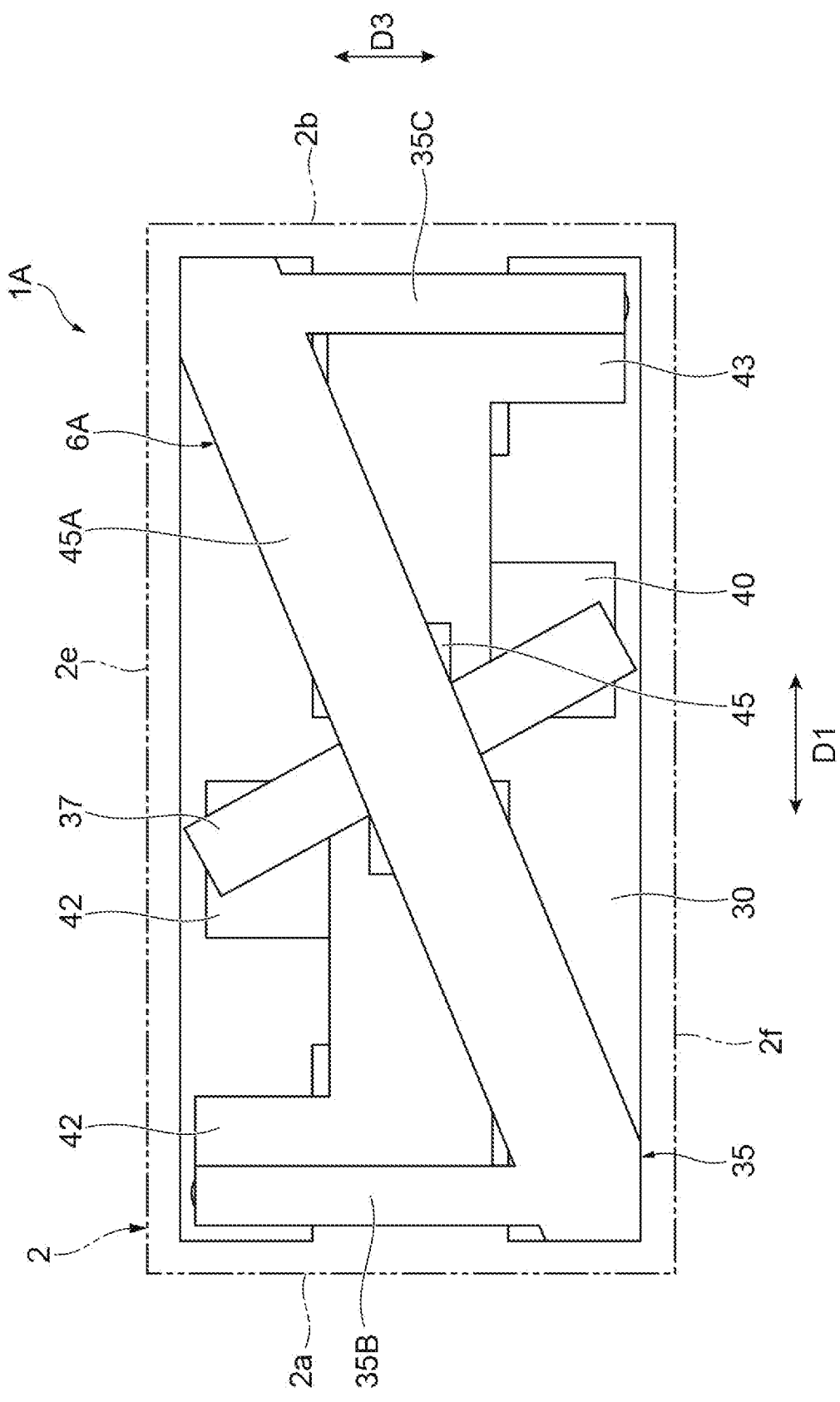
FIG. 10 is a top view of the electronic component shown in FIG. 8.
Figure 11:
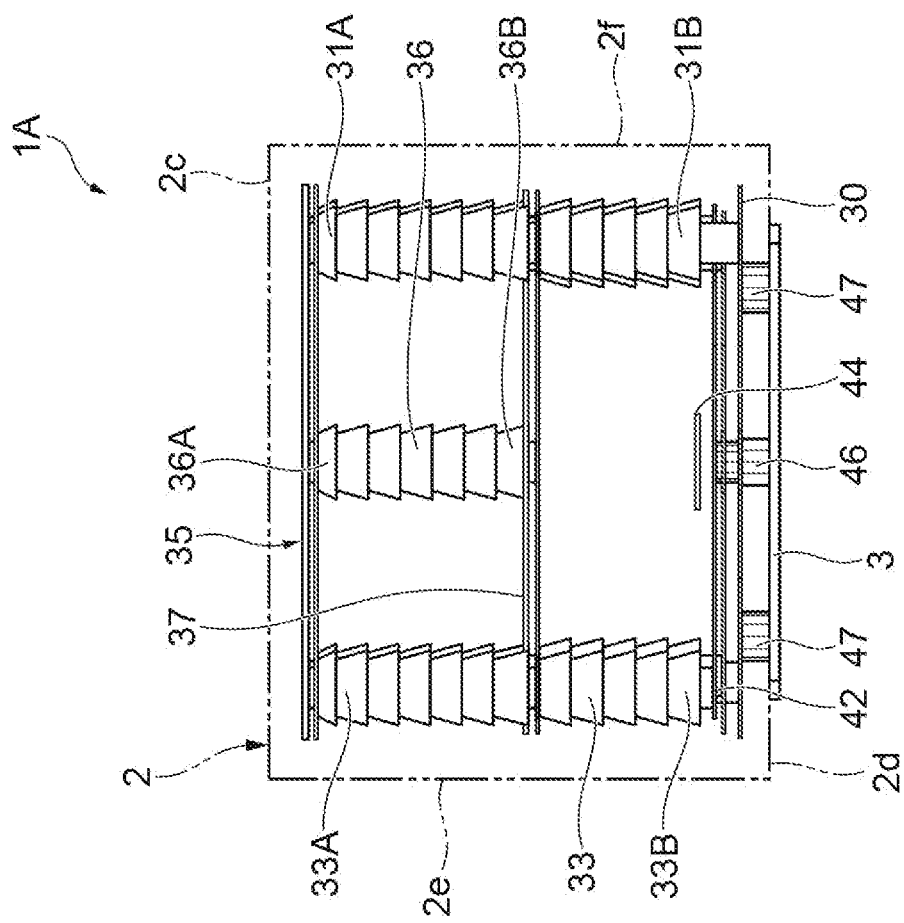
FIG. 11 is an end view of the electronic component shown in FIG. 8.
Figure 12:
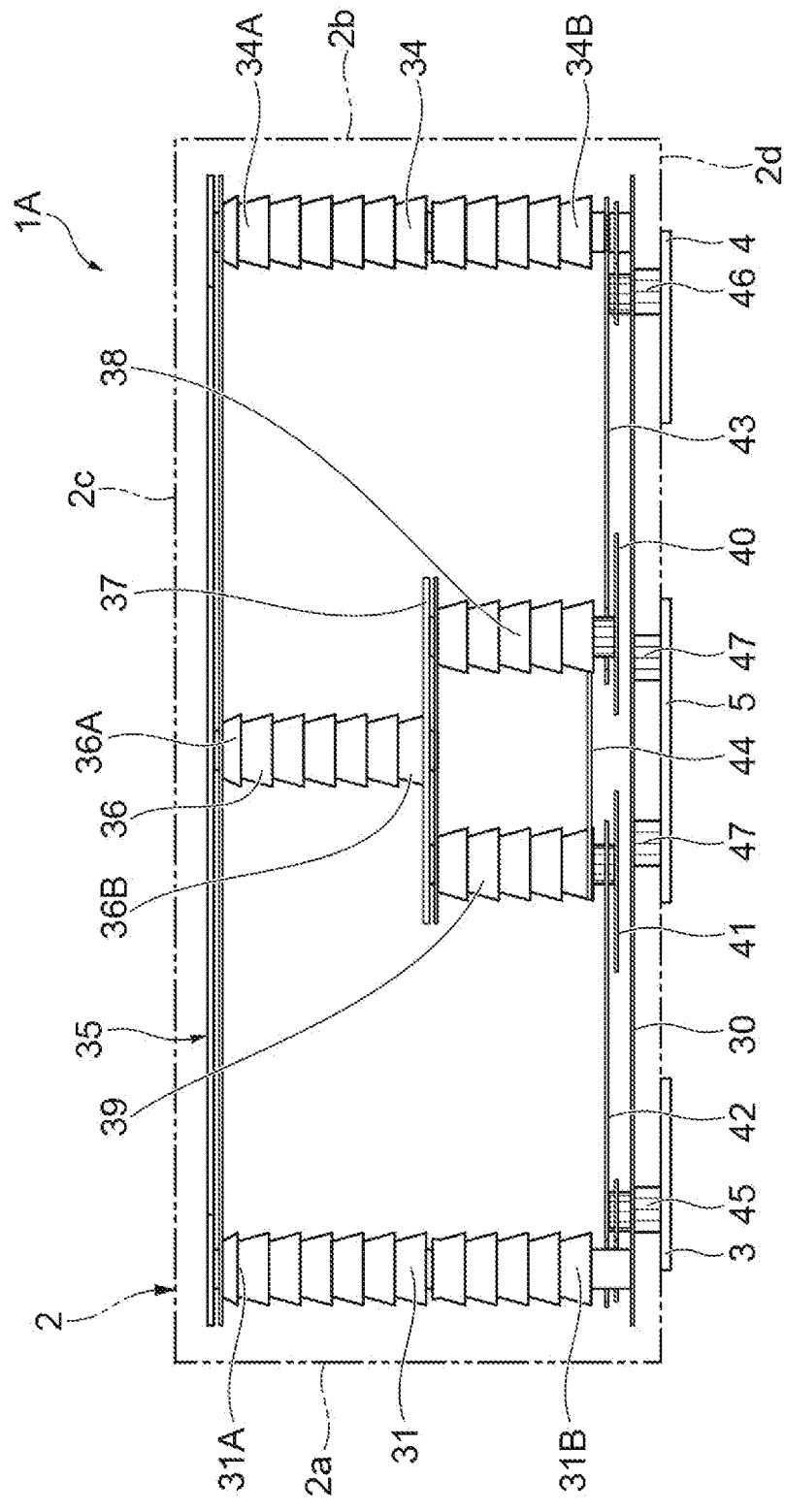
FIG. 12 is a side view of the electronic component shown in FIG. 8.

FIG. 10 is a top view of the electronic component shown in FIG. 8. FIG. 11 is an end view of the electronic component shown in FIG. 8. FIG. 12 is a side view of the electronic component shown in FIG. 8. As shown in FIGS. 8 to 12, the resonator 6A includes a ground conductor 30, a first conductor 31, a second conductor 32, a third conductor 33, a fourth conductor 34, an inductor conductor 35, a connecting conductor 36, a connection conductor 37, a connection conductor (third connection conductor) 38, a connection conductor (third connection conductor) 39, a capacitor pad 40, a capacitor pad 41, a capacitor pad 42, a capacitor pad 43, and a capacitor pad 44.

The ground conductor 30 is arranged on the main surface 2d side of the element body 2. The ground conductor 30 has an approximately H shape when viewed from the second direction D2. The ground conductor 30 is electrically connected to the first terminal electrode 3, the second terminal electrode 4, and the third terminal electrode 5. The ground conductor 30 and the first terminal electrode 3 are electrically connected to each other by a connection conductor 45. The ground conductor 30 and the second terminal electrode 4 are electrically connected to each other by a connection conductor 46. The ground conductor 30 and the third terminal electrode 5 are electrically connected to each other by a plurality of connection conductors 47.

The first conductor 31 extends along the second direction D2. The first conductor 31 has, for example, a cylindrical shape. The first conductor 31 can be formed by a plurality of via conductors. The first conductor 31 is arranged at each corner of the element body 2. Specifically, the first conductor 31 is arranged at a corner formed by the end surface 2a and the side surface 2f when viewed from the second direction D2. The first conductor 31 has a first end portion 31A and a second end portion 31B. The first end portion 31A of the first conductor 31 is connected to a first inductor conductor 35A and a second inductor conductor 35B (inductor conductor 35). The second end portion 31B of the first conductor 31 is connected to the ground conductor 30.

The second conductor 32 extends along the second direction D2. The second conductor 32 has, for example, a cylindrical shape. The second conductor 32 can be formed by a plurality of via conductors. The second conductor 32 is arranged at each corner of the element body 2. Specifically, the second conductor 32 is arranged at a corner formed by the end surface 2b and the side surface 2e when viewed from the second direction D2. In the element body 2, the second conductor 32 and the first conductor 31 are arranged at positions on the first diagonal line. The second conductor 32 has a first end portion 32A and a second end portion 32B. The first end portion 32A of the second conductor 32 is connected to the first inductor conductor 35A and a third inductor conductor 35C (inductor conductor 35). The second end portion 32B of the second conductor 32 is connected to the ground conductor 30.

The third conductor 33 extends along the second direction D2. The third conductor 33 has, for example, a cylindrical shape. The third conductor 33 can be formed by a plurality of via conductors. The third conductor 33 is arranged at each corner of the element body 2. Specifically, the third conductor 33 is arranged at a corner formed by the end surface 2a and the side surface 2e when viewed from the second direction D2. The third conductor 33 is arranged at a predetermined distance from the first conductor 31 in the third direction D3. The third conductor 33 has a first end portion 33A and a second end portion 33B. The first end portion 33A of the third conductor 33 is connected to the second inductor conductor 35B (inductor conductor 35). The second end portion 33B of the third conductor 33 is connected to the capacitor pad 42.

The fourth conductor 34 extends along the second direction D2. The fourth conductor 34 has, for example, a cylindrical shape. The fourth conductor 34 can be formed by a plurality of via conductors. The fourth conductor 34 is arranged at each corner of the element body 2. Specifically, the fourth conductor 34 is arranged at a corner formed by the end surface 2b and the side surface 2f when viewed from the second direction D2. In the element body 2, the fourth conductor 34 and the third conductor 33 are arranged on the second diagonal line crossing the first diagonal line. The fourth conductor 34 is arranged at a predetermined distance from the second conductor 32 in the third direction D3. The fourth conductor 34 has a first end portion 34A and a second end portion 34B. The first end portion 34A of the fourth conductor 34 is connected to the third inductor conductor 35C (inductor conductor 35). The second end portion 34B of the fourth conductor 34 is connected to the capacitor pad 43.

The inductor conductor 35 forms an inductor. In the present embodiment, the inductor conductor 35 is formed by two conductors arranged so as to face each other in the second direction D2. As shown in FIG. 10, the inductor conductor 35 has an approximately Z shape when viewed from the second direction D2. The inductor conductor 35 has the first inductor conductor 35A, the second inductor conductor 35B, and the third inductor conductor 35C. In the present embodiment, the first inductor conductor 35A, the second inductor conductor 35B, and the third inductor conductor 35C are integrally formed.

The first inductor conductor 35A has a predetermined width, and extends linearly. The first inductor conductor 35A electrically connects the first conductor 31 and the second conductor 32 to each other. The first inductor conductor 35A is bridged between the first end portion 31A of the first conductor 31 and the first end portion 32A of the second conductor 32.

The second inductor conductor 35B has a predetermined width, and extends linearly. The second inductor conductor 35B electrically connects the first conductor 31 and the third conductor 33 to each other. The second inductor conductor 35B is bridged between the first end portion 31A of the first conductor 31 and the first end portion 33A of the third conductor 33.

The third inductor conductor 35C has a predetermined width, and extends linearly. The third inductor conductor 35C electrically connects the second conductor 32 and the fourth conductor 34 to each other. The third inductor conductor 35C is bridged between the first end portion 32A of the second conductor 32 and the first end portion 34A of the fourth conductor 34.

One end portion of the first inductor conductor 35A and one end portion of the second inductor conductor 35B are connected to each other. The other end portion of the first inductor conductor 35A and one end portion of the third inductor conductor 35C are connected to each other.

The connecting conductor 36 extends along the second direction D2. The connecting conductor 36 has, for example, a cylindrical shape. The connecting conductor 36 can be formed by a plurality of via conductors. The connecting conductor 36 has a first end portion 36A and a second end portion 36B. The first end portion 36A of the connecting conductor 36 is connected to the inductor conductor 35. Specifically, the first end portion 36A is connected to the first inductor conductor 35A. The connecting conductor 36 is connected to a central portion of the first inductor conductor 35A in its extending direction. The second end portion 36B of the connecting conductor 36 is connected to the connection conductor 37.

A connection conductor 38 is connected to one end portion of the connection conductor 37 in its extending direction. The connection conductor 38 extends along the second direction D2. The capacitor pad 40 is connected to the connection conductor 38. The capacitor pad 40 has an approximately rectangular shape. The capacitor pad 40 is arranged so as to face the ground conductor 30. A connection conductor 39 is connected to the other end portion of the connection conductor 37 in its extending direction. The connection conductor 39 extends along the second direction D2. The capacitor pad 41 is connected to the connection conductor 39. The capacitor pad 41 has an approximately rectangular shape. The capacitor pad 41 is arranged so as to face the ground conductor 30.

Each of the capacitor pads 42 and 43 has an approximately L shape when viewed from the second direction D2. The capacitor pad 44 has a rectangular shape when viewed from the second direction D2. The capacitor pad 44 is arranged at a position overlapping each of the capacitor pad 42 and the capacitor pad 43.

As described above, in the electronic component 1A according to the present embodiment, the connecting conductor 36 electrically connected to the capacitor pads 40 and 41 is connected to the first inductor conductor 35A bridged between the first conductor 31 and the second conductor 32, and is located between the first conductor 31 and the second conductor 32. That is, the connecting conductor 36 is suspended from the first inductor conductor 35A. Therefore, in the electronic component 1A, a space is formed between the first conductor 31 and the connecting conductor 36 and between the second conductor 32 and the connecting conductor 36. For this reason, in the electronic component 1A, a magnetic field can be formed around the connecting conductor 36 because a region where a magnetic flux is generated can be secured around the connecting conductor 36. Therefore, in the electronic component 1A, it is possible to increase the apparent volume of an inductor formed by the first conductor 31, the second conductor 32, the first inductor conductor 35A, and the connecting conductor 36. As a result, in the electronic component 1A, it is possible to improve the Q factor.

The electronic component 1A according to the present embodiment includes the second end portion 36B of the connecting conductor 36 and the connection conductors 38 and 39 that connect the plurality of capacitor pads 40 and 41 to each other. Therefore, in the electronic component 1A, a plurality of resonators can be formed.

While the embodiment of the present invention has been described above, the present invention is not necessarily limited to the embodiment described above, and various changes can be made without departing from the scope of the present invention.

In the first embodiment described above, a form in which the inductor conductor 15 of the electronic component 1 includes the first inductor conductor 18 and the second inductor conductor 19 has been described as an example. However, the electronic component 1 may be configured to include only the first inductor conductor 18 (second inductor conductor 19).

In the first embodiment described above, a form in which the connecting conductor 16 is connected to the central portion of each of the first inductor conductor 18 and the second inductor conductor 19 in its extending direction has been described as an example. However, the connecting conductor 16 may be connected to other positions.

In the second embodiment described above, a form in which the connecting conductor 36 is connected to the central portion of the first inductor conductor 35A in its extending direction has been described as an example. However, the connecting conductor 36 may be connected to other positions of the first inductor conductor 35A.

What is claimed is:

1. An electronic component, comprising:
a first conductor extending in one direction;
a second conductor extending in the one direction;
a first connection conductor bridged so as to linearly extend between an end portion of the first conductor in its extending direction and an end portion of the second conductor in its extending direction;
a connecting conductor that extends in the one direction and has a first end portion and a second end portion in its extending direction, the first end portion being connected to the first connection conductor and being located between the first conductor and the second conductor; and
a capacitor pad electrically connected to the second end portion of the connecting conductor.

2. The electronic component according to claim 1, wherein the first end portion of the connecting conductor is connected to a central portion of the first connection conductor in its extending direction.

3. The electronic component according to claim 1, further comprising:
a third conductor extending in the one direction;
a fourth conductor extending in the one direction; and
a second connection conductor bridged so as to linearly extend between an end portion of the third conductor in its extending direction and an end portion of the fourth conductor in its extending direction,
wherein the first end portion of the connecting conductor is connected to the second connection conductor and is located between the third conductor and the fourth conductor.

4. The electronic component according to claim 3,
wherein the first connection conductor and the second connection conductor are arranged such that an extending direction of the first connection conductor and an extending direction of the second connection conductor cross each other when viewed from the one direction, and
the first end portion of the connecting conductor is connected to an intersection between the first connection conductor and the second connection conductor.

5. The electronic component according to claim 3, further comprising:
an element body having a pair of end surfaces facing each other in a first direction, a pair of mounting surface and main surface facing each other in a second direction, and a pair of side surfaces facing each other in a third direction and having a rectangular parallelepiped shape,
wherein the first conductor, the second conductor, the third conductor, and the fourth conductor extend along the second direction, and
when viewed from the second direction, the first conductor and the second conductor are located on a first diagonal line in the element body, and the third conductor and the fourth conductor are located on a second diagonal line crossing the first diagonal line in the element body.

6. The electronic component according to claim 1, further comprising:
a plurality of the capacitor pads; and
a third connection conductor that connects the second end portion of the connecting conductor and each of the plurality of capacitor pads to each other.

* * * * *